(12) United States Patent
Honda et al.

(10) Patent No.: US 11,588,450 B2
(45) Date of Patent: Feb. 21, 2023

(54) AMPLIFICATION CIRCUIT AND COMMUNICATION DEVICE

(71) Applicant: Murata Manufacturing Co., Ltd., Kyoto (JP)

(72) Inventors: Keiichi Honda, Kyoto (JP); Masamichi Tokuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 187 days.

(21) Appl. No.: 17/111,773

(22) Filed: Dec. 4, 2020

(65) Prior Publication Data

US 2021/0175862 A1 Jun. 10, 2021

(30) Foreign Application Priority Data

Dec. 10, 2019 (JP) .............................. JP2019-222742

(51) Int. Cl.
*H03F 3/16* (2006.01)
*H03F 3/195* (2006.01)
*H03F 1/56* (2006.01)

(52) U.S. Cl.
CPC ............. *H03F 3/195* (2013.01); *H03F 1/565* (2013.01); *H03F 2200/294* (2013.01); *H03F 2200/318* (2013.01); *H03F 2200/451* (2013.01)

(58) Field of Classification Search
CPC .. H03F 3/16; H03F 3/20; H03F 3/191; H03G 3/30
USPC ......................................... 330/277, 302, 285
See application file for complete search history.

(56) References Cited

U.S. PATENT DOCUMENTS

| 5,329,249 | A | * | 7/1994 | Cripps | ................... H03F 3/1935 330/306 |
| 7,750,739 | B2 | * | 7/2010 | Fu | .............................. H03F 1/26 330/294 |
| 9,973,149 | B2 | * | 5/2018 | Ayranci | ................... H03F 1/565 |
| 10,491,164 | B2 | * | 11/2019 | Ayranci | ................... H03F 3/193 |
| 11,139,785 | B2 | * | 10/2021 | Hiraoka | ..................... H03F 3/19 |
| 2018/0083762 | A1 | | 3/2018 | Kogure | |

FOREIGN PATENT DOCUMENTS

| JP | 2012004777 A | 1/2012 |
| JP | 2018050159 A | 3/2018 |

* cited by examiner

*Primary Examiner* — Henry Choe
(74) *Attorney, Agent, or Firm* — Pearne & Gordon LLP (57) ABSTRACT

Provided is an amplification circuit that includes: a low-noise amplifier that includes an FET as an amplification element and that amplifies a radio-frequency signal inputted to the gate of the FET; an input matching network that matches the input impedance of the low-noise amplifier; and a switch that is serially connected between ground and a node on a line connecting the input matching network and the gate of the FET to each other.

11 Claims, 9 Drawing Sheets

AMPLIFICATION CIRCUIT AND COMMUNICATION DEVICE

CROSS REFERENCE TO RELATED APPLICATION

This application claims priority from Japanese Patent Application No. 2019-222742 filed on Dec. 10, 2019. The content of this application is incorporated herein by reference in its entirety.

BACKGROUND OF THE DISCLOSURE

Field of the Disclosure

The present disclosure relates to an amplification circuit and a communication device.

Description of the Related Art

In the related art, there is known a transmission/reception module that includes a power amplifier that amplifies a transmission signal and a low-noise amplifier that amplifies a reception signal (for example, refer to Japanese Unexamined Patent Application Publication No. 2018-50159). In the transmission/reception module disclosed in Japanese Unexamined Patent Application Publication No. 2018-50159, matching networks, which perform impedance matching, are provided at the output side of the power amplifier and at the input side of the low-noise amplifier.

Generally, a matching network includes an inductor, a capacitor, a wiring line, or the like. Therefore, if the matching network on the input side of the low-noise amplifier is electromagnetically coupled with an inductor, a capacitor, or a wiring line of another electrical circuit, there is a risk of a leakage signal from the other electrical circuit being supplied to the low-noise amplifier. There is a problem in that the rise of an amplification element included in the low-noise amplifier will be retarded by the leakage signal supplied to the low-noise amplifier. This means that it will be difficult for the low-noise amplifier to operate at high speed.

BRIEF SUMMARY OF THE DISCLOSURE

Accordingly, it is an object of the present disclosure to provide an amplification circuit and a communication device that are capable of high-speed operation.

An amplification circuit according to a preferred embodiment of the present disclosure includes: a first amplifier that includes a field effect transistor (FET) as an amplification element and that amplifies a radio-frequency signal inputted to a gate of the FET; an input matching network that matches an input impedance of the first amplifier; and a switch that is serially connected between ground and a node on a path connecting the input matching network and the gate to each other.

A communication device according to a preferred embodiment of the present disclosure includes: the above-described amplification circuit; and an RF signal processing circuit that processes a radio-frequency signal amplified by the first amplifier.

According to the preferred embodiments of the present disclosure, an amplification circuit and a communication device that are capable of high-speed operation can be provided.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereafter, an amplification circuit and a communication device according to embodiments of the present disclosure will be described in detail using the drawings. The embodiments described hereafter each illustrate a specific example of the present disclosure. Therefore, the numerical values, shapes, materials, constituent elements, arrangements of the constituent elements, the ways in which the constituent elements are connected, steps, the order of the steps, and so forth described in the following embodiments are merely examples and are not intended to limit the present disclosure. Therefore, constituent elements not described in the independent claims among constituent elements in the following embodiments are described as arbitrary constituent elements.

In addition, the drawings are schematic drawings and are not necessarily illustrated in a strictly accurate manner. Therefore, for example, the scale and so forth are not necessarily the same as each other in the individual drawings. Furthermore, in the drawings, configurations that are substantially the same as each other are denoted by the same symbols and repeated description thereof is omitted or simplified.

In addition, in the present specification, "connected" refers to not only a case where two or more elements are directly connected to each other, but also refers to a case where two or more elements are indirectly connected to each other via one or more other components or circuit elements or via a connection member such as solder. The same applies to "connection" and "connect".

Embodiment 1

1. Configuration of Amplification Circuit

First, the configuration of an amplification circuit according to embodiment 1 will be described using FIG. 1.

Figure 1:
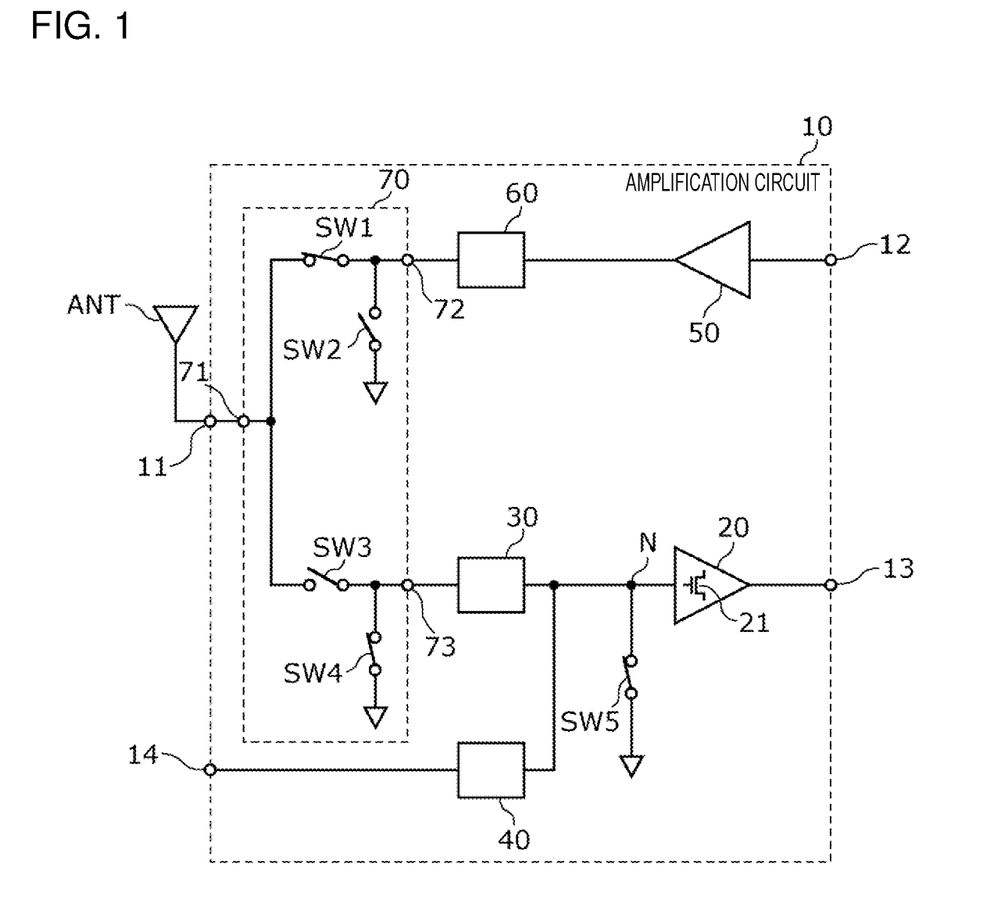
FIG. 1 is a circuit configuration diagram illustrating an example of an amplification circuit according to embodiment 1.

FIG. 1 is a circuit configuration diagram illustrating an amplification circuit 10 according to this embodiment.

The amplification circuit 10 is a circuit for amplifying radio-frequency signals. In this embodiment, the amplification circuit 10 amplifies a transmission signal transmitted via an antenna ANT and a reception signal received via the antenna ANT. Here, the transmission signal and the reception signal are both examples of a reception signal. The operation band of the amplification circuit 10 is, for example, the frequency band of a 5 GHz band wireless local area network (LAN).

As illustrated in FIG. 1, the amplification circuit 10 includes a low-noise amplifier (LNA) 20, an input matching network 30, a bias circuit 40, a power amplifier (PA) 50, an output matching network 60, and a switch circuit 70.

Furthermore, the amplification circuit 10 includes an antenna connection terminal 11, an input terminal 12, an output terminal 13, and a bias input terminal 14. The antenna connection terminal 11, the input terminal 12, the output terminal 13, and the bias input terminal 14 are examples of external connection terminals for connecting the amplification circuit 10 to elements provided outside the amplification circuit 10.

The antenna connection terminal 11 is connected to the antenna ANT. The antenna connection terminal 11 is a radio-frequency input/output terminal. A transmission signal amplified by the amplification circuit 10 is outputted to the antenna ANT via the antenna connection terminal 11. A reception signal received by the antenna ANT is inputted to the amplification circuit 10 via the antenna connection terminal 11.

The input terminal 12 is a terminal to which a transmission signal is inputted prior to being amplified by the power amplifier 50. A path connecting the input terminal 12 and the antenna connection terminal 11 to each other is a path along which a transmission signal is transmitted (transmission path). The power amplifier 50, the output matching network 60, the switch circuit 70 are arranged along the transmission path.

The output terminal 13 is a terminal from which a reception signal amplified by the low-noise amplifier 20 is outputted. A path connecting the antenna connection terminal 11 and the output terminal 13 to each other is a path along which a reception signal is transmitted (reception path). The switch circuit 70, the input matching network 30, and the low-noise amplifier 20 are arranged along the reception path. A node N is located on a part of the reception path that connects the input matching network 30 and the low-noise amplifier 20 to each other. As illustrated in FIG. 1, the amplification circuit 10 includes a switch SW5 that is serially connected between the node N and ground.

The bias input terminal 14 is a terminal to which a bias voltage for an amplification element of the low-noise amplifier 20 is inputted.

The low-noise amplifier 20 is an example of a first amplifier that amplifies a radio-frequency signal. The low-noise amplifier 20 includes an FET 21 as an amplification element and amplifies a radio-frequency signal inputted to the gate of the FET 21. The low-noise amplifier 20 amplifies a reception signal received by the antenna ANT.

The FET 21 amplifies a reception signal inputted to the gate thereof and outputs the amplified reception signal. FET 21 is a metal oxide semiconductor FET (MOSFET). The FET 21 is, for example, an N-channel MOSFET, but may instead be a P-channel MOSFET.

The input matching network 30 matches the input impedance of the low-noise amplifier 20. In this embodiment, the input matching network 30 is a step-up impedance matching network. A step-up impedance matching network is a circuit that transforms an impedance from a low impedance to a high impedance. In other words, the input impedance of the input matching network 30 is lower than the output impedance of the input matching network 30. The input matching network 30 includes at least one inductor or capacitor.

The bias circuit 40 is a circuit for supplying a bias voltage to the base of the FET 21 of the low-noise amplifier 20. The bias circuit 40 transforms the voltage value of a bias voltage inputted to the bias input terminal 14 into a desired value and supplies the transformed bias voltage to the base of the FET 21. The bias circuit 40 is connected at a point nearer the input matching network 30 than the node N. As discussed in detail later, at least one of the circuit elements included in the bias circuit 40 may be shared with circuit elements included in the input matching network 30.

The power amplifier 50 is an example of a second amplifier that amplifies a radio-frequency signal. The power amplifier 50 amplifies a transmission signal transmitted from the antenna ANT. Although not illustrated, the power amplifier 50 includes an FET as an amplification element. Alternatively, the power amplifier 50 may include a bipolar transistor as an amplification element. The power amplifier 50 may include a plurality of cascode-connected transistors or may include a single common-source (or common-emitter) transistor as an amplification element.

The output matching network 60 matches the output impedance of the power amplifier 50. The output matching network 60 includes at least one inductor or capacitor.

The switch circuit 70 includes a first terminal 71, a second terminal 72, and a third terminal 73. The first terminal 71 is connected to the antenna ANT via the antenna connection terminal 11. Note that the first terminal 71 and the antenna connection terminal 11 may be physically configured as a single terminal. The first terminal 71 is a common terminal that is a connection point between the transmission path and the reception path.

The second terminal 72 is connected to the output terminal of the power amplifier 50 via the output matching network 60. A path connecting the first terminal 71 and the second terminal 72 is part of the transmission path.

The third terminal 73 is connected to the gate of the low-noise amplifier 20 via the input matching network 30. A path connecting the first terminal 71 and the third terminal 73 is part of the reception path.

The switch circuit 70 switches the first terminal 71 and the second terminal 72 and the first terminal 71 and third terminal 73 between being in a conductive state and a non-conductive state with each other. The switch circuit 70 is a transmission/reception switching circuit that selectively switches the connection target of the antenna ANT to the transmission path or the reception path of the amplification circuit 10.

Specifically, the switch circuit 70 includes a L-shaped switch section in which a series switch and a shunt switch are provided on both the transmission side and the reception side. Specifically, as illustrated in FIG. 1, the switch circuit 70 includes switches SW1, SW2, SW3, and SW4.

The switch SW1 is a series switch that is serially connected along the transmission path. Specifically, the switch SW1 is serially connected along a path connecting the first terminal 71 and the second terminal 72.

The switch SW2 is a shunt switch that is serially connected between the transmission path and ground. Specifically, the switch SW2 is serially connected between ground and a path connecting the switch SW1 and the second terminal 72 to each other.

When a transmission signal is to be transmitted via the antenna ANT, that is, when the transmission path is put into a conductive state (at a transmission time), the switch SW1 is put into a conductive state and the switch SW2 is put into a non-conductive state. When a reception signal is received via the antenna ANT, that is, when the reception path is put into a conductive state (at a reception time), the switch SW1 is put into a non-conductive state and the switch SW2 is put into a conductive state. Thus, leaking of a reception signal into the transmission path can be suppressed.

The switch SW3 is a series switch that is serially connected along the reception path. Specifically, the switch SW3 is serially connected along a path connecting the first terminal 71 and the third terminal 73.

The switch SW4 is a shunt switch that is serially connected between the reception path and ground. Specifically, the switch SW4 is serially connected between ground and a path connecting the switch SW3 and the third terminal 73 to each other.

When a reception signal is received via the antenna ANT, that is, when the reception path is put into a conductive state (at a reception time), the switch SW3 is put into a conductive state and the switch SW4 is put into a non-conductive state. When a transmission signal is to be transmitted via the antenna ANT, that is, when the transmission path is put into a conductive state (at a transmission time), the switch SW3 is put into a non-conductive state and the switch SW4 is put into a conductive state. Thus, leaking of a transmission signal into the reception path can be suppressed.

The switch circuit 70 may include a T-shaped switch section provided with two series switches and one shunt switch on at least one out of the transmission side and the reception side. The shunt switch in this case would be connected between ground and a connection section between the two series switches.

The switches SW1 to SW4 are, for example, FETs, but may instead be bipolar transistors. Switching of each of the switches SW1 to SW4 between a conductive state (on) and a non-conductive state (off) is performed by a control unit not illustrated in FIG. 1.

Note that the switch circuit of the amplification circuit 10 is not limited to the configuration of the switch circuit 70 illustrated in FIG. 1. For example, as illustrated in FIG. 2, an amplification circuit 10a may include a switch circuit 70a instead of the switch circuit 70.

Figure 2:
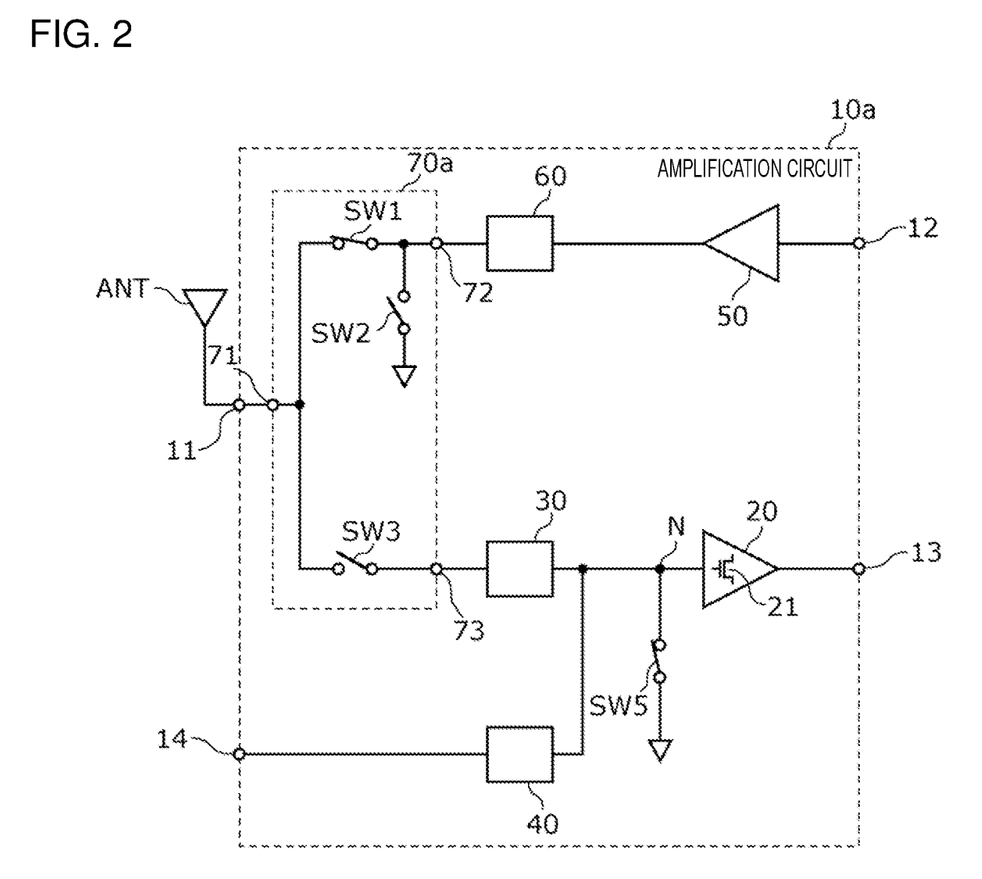
FIG. 2 is a circuit configuration diagram illustrating another example of an amplification circuit according to embodiment 1.

The amplification circuit 10a illustrated in FIG. 2 is another example of an amplification circuit according to this embodiment. FIG. 2 is a circuit configuration diagram illustrating the amplification circuit 10a according to this embodiment.

The switch circuit 70a does not include the switch SW4. In other words, no switch is serially connected between ground and the path connecting first terminal 71 and the input matching network 30 to each other. Specifically, only the switch SW3 is arranged along the path connecting the first terminal 71 and the third terminal 73 to each other.

Thus, the amplification circuit 10a can be reduced in size since the number of switches included in the switch circuit 70a can be reduced. Since the amplification circuit 10a includes the switch SW5, flowing of a transmission signal into the low-noise amplifier 20 can be suppressed by the switch SW5. Specifically, isolation between the transmission path and the reception path in the amplification circuit 10a can be made equivalent to the isolation between the transmission path and the reception path in the amplification circuit 10.

2. Function of Switch SW5

Next, the specific function of the switch SW5 of the amplification circuit 10 or 10a will be described.

2-1. Comparative Example

First, the configuration of a comparative example not provided with the switch SW5 and problems with the configuration of the comparative example will be described.

Figure 3:
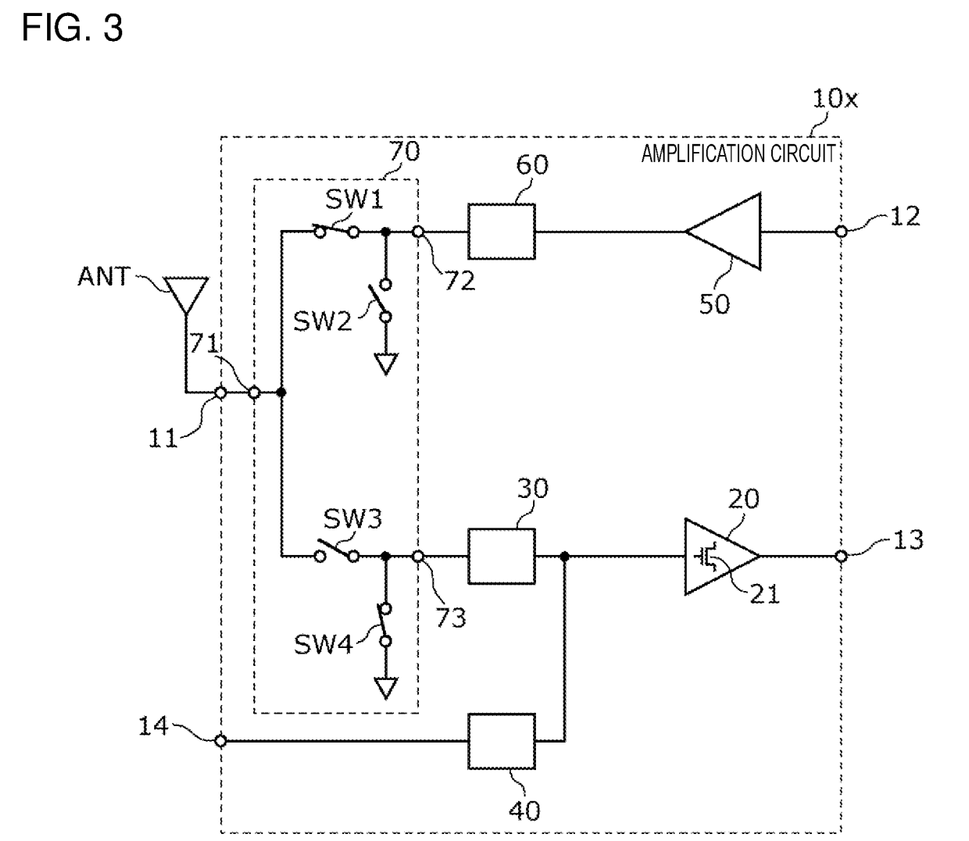
FIG. 3 is a circuit configuration diagram of an amplification circuit according to a comparative example.

FIG. 3 is a circuit configuration diagram of an amplification circuit 10x according to the comparative example. As illustrated in FIG. 3, the amplification circuit 10x according to the comparative example differs from the amplification circuit 10 illustrated in FIG. 1 only in that the amplification circuit 10x is not provided with the switch SW5.

In the amplification circuit 10x according to the comparative example, the input matching network 30 and the output matching network 60 include circuit elements that electromagnetically couple with each other such as inductors, capacitors, wiring lines, or the like. Therefore, as a result the input matching network 30 electromagnetically coupling with the output matching network 60, part of a transmission signal flowing through the output matching network 60 is supplied as a leakage signal to the gate of the FET 21 of the low-noise amplifier 20 via the input matching network 30.

Furthermore, part of the transmission signal is also supplied to the gate of the FET 21 of the low-noise amplifier 20 as a leakage signal in the case where the isolation between the transmission path and the reception path inside the switch circuit 70 is insufficient. In particular, when the switch circuit 70, the low-noise amplifier 20, and the input matching network 30 are provided inside the same module or integrated circuit (IC), the isolation between the circuits is more likely to be insufficient due to the physical distance between the circuits being small. Increasing the distance between the circuits in order to secure the isolation may be considered, but there would be an increase in the size of the module or IC. In other words, it is difficult to secure both size reduction and isolation for the amplification circuit 10x.

Through studies, the inventors of the present application discovered a problem that the low-noise amplifier 20 has a slow start-up time when isolation is not sufficiently secured. This problem will be described in detail below.

Figure 4:
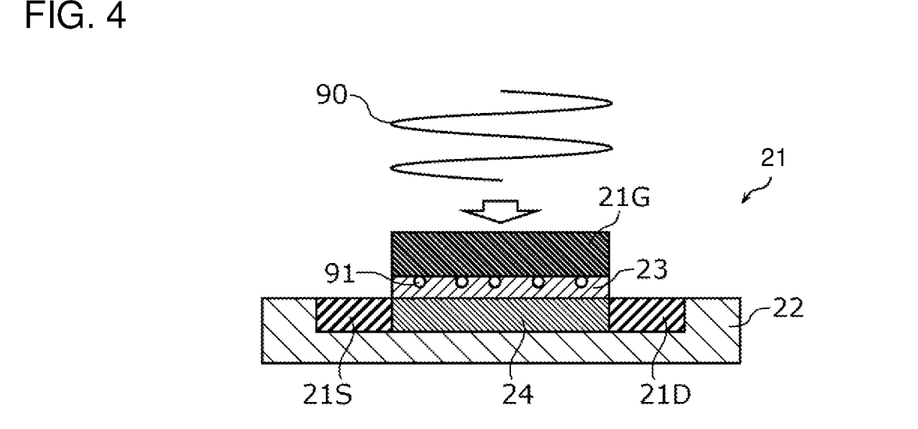
FIG. 4 is a schematic sectional view of an FET, which is an amplification element.

FIG. 4 is a schematic sectional view of the FET 21, which is an amplification element. As illustrated in FIG. 4, the FET 21 includes a source 21S, a drain 21D, a channel 24, a gate insulating film 23, and a gate 21G, which are formed in or on a semiconductor substrate 22.

The source 21S, the drain 21D, and the channel 24 are impurity regions formed inside the semiconductor substrate 22. For example, in the case where the semiconductor substrate 22 is a p-type silicon substrate, the source 21S and the drain 21D are regions that have been doped with an n-type impurity. The source 21S and the drain 21D are connected to electrodes, vias, or wiring lines formed using a conductive material. The gate insulating film 23 is, for example, a silicon oxide film and is provided on the channel 24. The gate 21G is provided on the gate insulating film 23. Note that FIG. 4 merely illustrates the cross-sectional shape of a general MOSFET, and the shape and configuration of the FET 21 are not particularly limited.

When the isolation between the matching networks of the transmission path and the reception path or the isolation inside the switch circuit 70 is insufficient like in the amplification circuit 10x illustrated in FIG. 3, a leakage signal 90 is supplied to the gate 21G of the FET 21 via the input matching network 30. As illustrated in FIG. 4, when the leakage signal 90 is supplied to the gate 21G of the FET 21, electrons 91 accumulate in the gate insulating film 23 of the FET 21. The potential of the gate 21G is reduced due to the accumulation of the electrons 91, and therefore when a bias voltage is applied to the gate 21G in order to make the FET 21 operate as an amplification element, a longer time is required until the desired bias voltage is applied to gate 21G. In other words, a longer time is required in order to release the electrons 91 that have accumulated in the gate insulating film 23. Therefore, the start-up time of the low-noise amplifier 20 is increased and the low-noise amplifier 20 is not able to operate at high speed.

2-2. Effect of Switch SW5

In contrast to the comparative example described above, the switch SW5 is provided in the amplification circuits 10 and 10a according to this embodiment.

As illustrated in FIGS. 1 and 2, the switch SW5 is serially connected between ground and the node N on a path connecting the input matching network 30 and the gate of the FET 21. Note that the phrase "serially connected between ground and the node N on a path connecting the input matching network 30 and the gate of the FET 21" as used herein means serially connected between ground and a path connecting the input matching network 30 and the gate of the FET 21. In the examples illustrated in FIGS. 1 and 2, the switch SW5 is directly connected (without any interposing other circuit elements) to the node N and ground.

When a reception signal is received via the antenna ANT, that is, when the reception path is put into a conductive state (at a reception time), the switch SW5 is put into a non-conductive state (off). When a transmission signal is to be transmitted via the antenna ANT, that is, when the transmission path is put into a conductive state (at a transmission time), the switch SW5 is put into a conductive state (on).

The switch SW5 is, for example, an FET, but may instead be a bipolar transistor. Switching on and off of the switch SW5 is performed by a control circuit, which is not illustrated in FIG. 1. FIG. 1 illustrates the on/off states of the switches SW1 to SW5 for when a transmission signal is to be transmitted.

The input impedance of the low-noise amplifier 20 is less than or equal to the on resistance of the switch SW5 when the switch SW5 is in a conductive state when a transmission signal is to be transmitted. Therefore, even if the leakage signal 90 attempts to enter the gate 21G of the FET 21 of the low-noise amplifier 20 via the switch circuit 70, the leakage signal 90 is efficiently reflected and is unlikely to enter the gate 21G. The same is true for the case where the input matching network 30 is electromagnetically coupled with the output matching network 60. A situation in which unwanted power arising from the transmission signal is applied to the gate 21G via the input matching network 30 can be suppressed by fixing the potential of the gate 21G to the ground potential via the switch SW5 in a conductive state.

Thus, it is unlikely that the leakage signal 90 will be supplied to the gate 21G and it is unlikely that the electrons 91 will accumulate in the gate insulating film 23. Therefore, the start-up time in the case where the low-noise amplifier 20 is activated by switching from transmission to reception can be made shorter.

Figure 5:
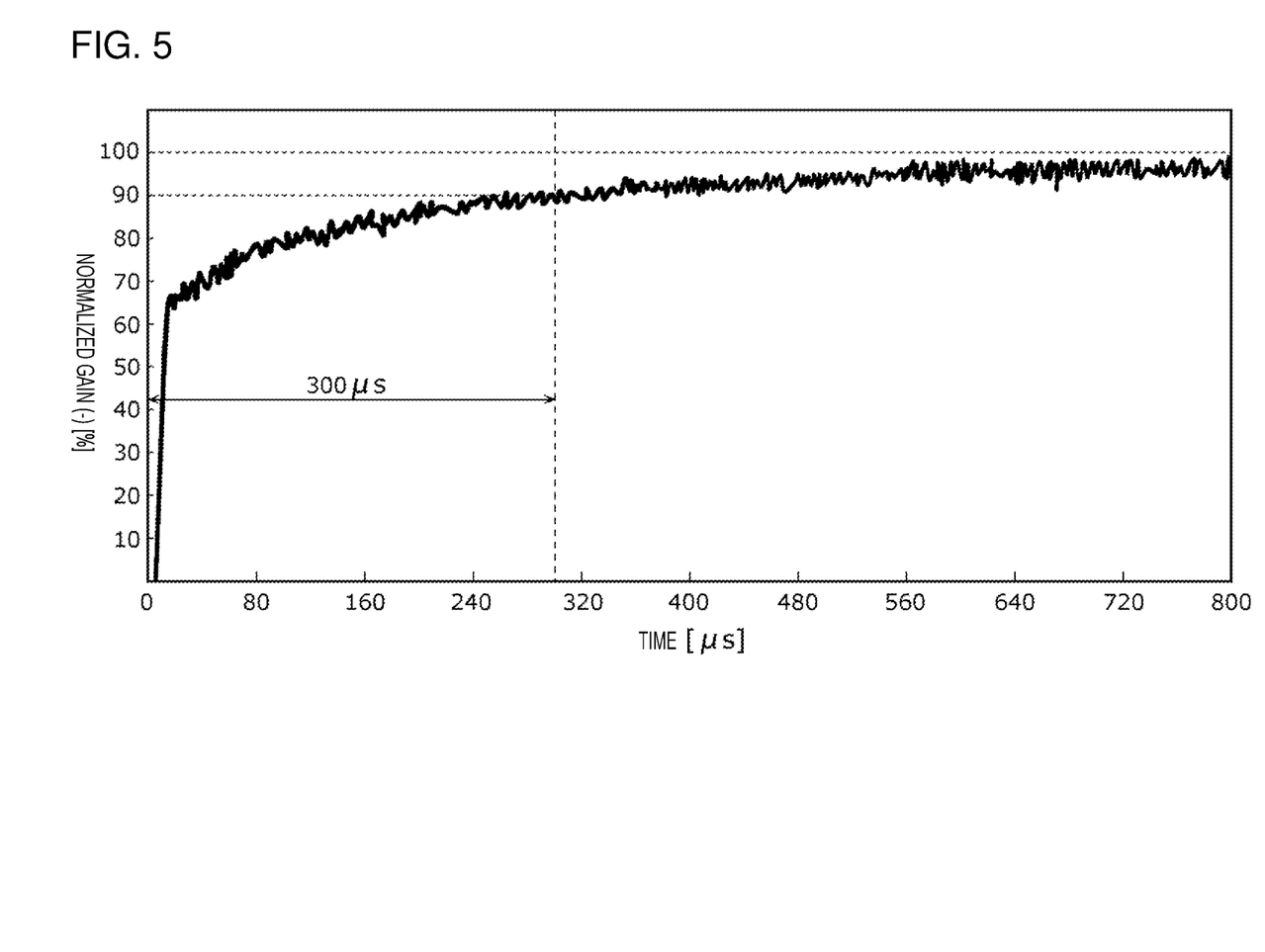
FIG. 5 is a diagram illustrating time variation of the normalized gain of an amplification circuit according to a comparative example.
Figure 6:
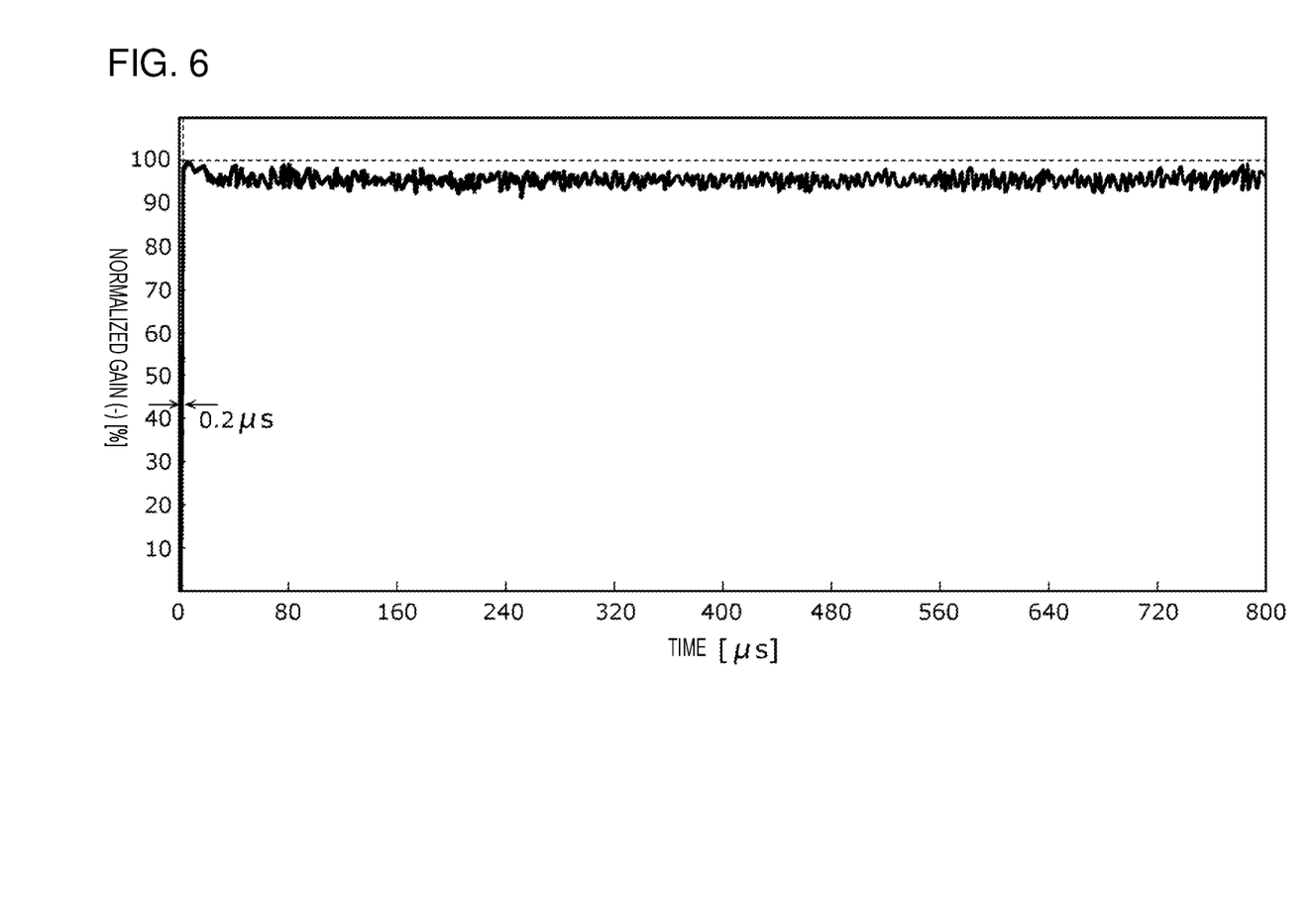
FIG. 6 is a diagram illustrating time variation of the normalized gain of an amplification circuit according to an example.

FIG. 5 is a diagram illustrating time variation of the normalized gain of the amplification circuit 10x according to the comparative example. FIG. 6 is a diagram illustrating time variation of the normalized gain of the amplification circuit 10a according to an example. In FIGS. 5 and 6, the horizontal axis represents time from the start of operation of the low-noise amplifier 20 and the vertical axis represents the normalized gain of the low-noise amplifier 20.

The starting point of operation of the low-noise amplifier 20 is the starting point of application of a bias voltage to the gate 21G of the FET 21. In addition, it is determined that the low-noise amplifier 20 is ready to operate as an amplifier, i.e., the low-noise amplifier 20 has been activated when the normalized gain has reached 90%.

As illustrated in FIG. 5, in the amplification circuit 10x according to the comparative example, around 300 μs is required until the low-noise amplifier 20 is activated. In contrast, as illustrated in FIG. 6, in the amplification circuit 10a according to the example, the start-up time is shortened to around 0.2 μs.

Thus, in the amplification circuits 10 and 10a, the start-up time of the low-noise amplifier 20 can be reduced, and therefore the speed of switching between transmission and reception can be increased when switching between transmission of a transmission signal and reception of a reception signal. Therefore, higher communication speed can also be realized.

In the case of the amplification circuit 10a that is not provided with the switch SW4 as well, isolation between transmission and reception can be sufficiently secured. In other words, the amplification circuit 10a can be reduced in size. Since the number of switches that are to be controlled can be reduced, the circuits can also be simplified.

Figure 7:
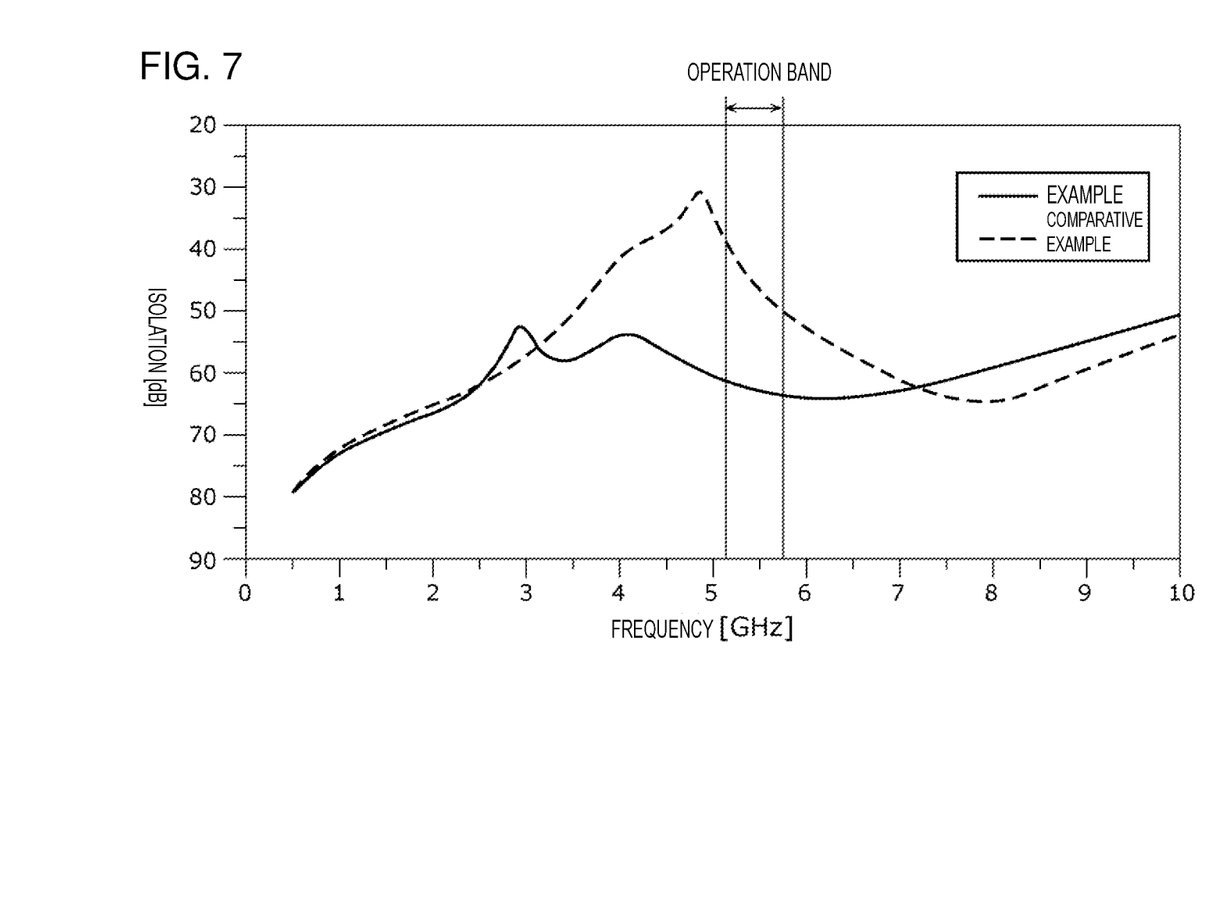
FIG. 7 is a diagram illustrating the isolation-frequency characteristics of the amplification circuits according to the example and the comparative example.

FIG. 7 is a diagram illustrating the isolation-frequency characteristics of the amplification circuit 10 or 10a according to the example and the amplification circuit 10x according to the comparative example. In FIG. 7, the horizontal axis represents the frequency of a radio-frequency signal to be amplified and the vertical axis represents the magnitude of isolation (insertion loss). Here, as an example, the operation band is a frequency band extending from 5.15 GHz to 5.85 GHz.

The graph of the comparative example illustrated in FIG. 7 illustrates the frequency characteristics of the isolation between the output terminal of the power amplifier 50 and the gate of the FET 21. The graph of the example illustrates the frequency characteristics of the isolation between the output terminal of the power amplifier 50 and the gate of the FET 21.

As illustrated in FIG. 7, in the operation band, the isolation in the amplification circuit 10a of the example is improved compared with the isolation in the amplification circuit 10x according to the comparative example. In particular, the isolation is improved by 20 dB or more at the low-frequency end of the operation band.

In this embodiment, no switch is serially connected along the path connecting the input matching network 30 and the gate of the FET 21. If a series switch is connected along the path, power loss due to the on resistance of the series switch will occur and the noise figure (NF) of the amplifier will deteriorate. According to this embodiment, since no series switch is connected along the path connecting the input matching network 30 and the gate of the FET 21, power loss along the path can be reduced and degradation of the NF can be suppressed.

3. Example

Next, a specific example of the amplification circuits 10 and 10a according to this embodiment will be described using FIG. 8.

Figure 8:
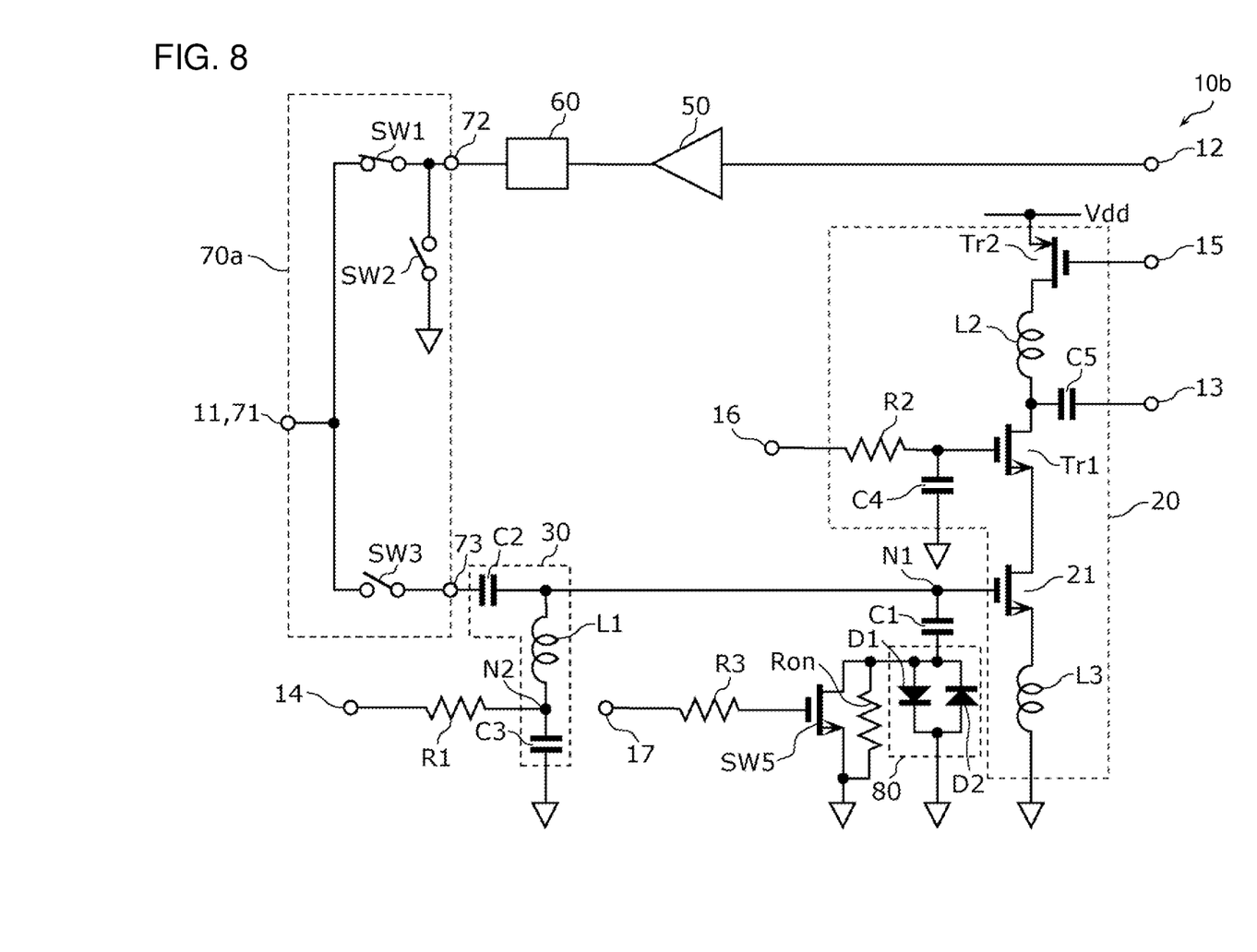
FIG. 8 is a circuit configuration diagram of an amplification circuit according to an example.

FIG. 8 is a circuit configuration diagram of an amplification circuit 10b according to an example. The amplification circuit 10b illustrated in FIG. 8 is a specific example of the amplification circuit 10a illustrated in FIG. 2. Specific examples of the configurations of the low-noise amplifier 20, the input matching network 30, the bias circuit 40, and the switch SW5 are illustrated. In addition, the amplification circuit 10b includes a capacitor C1 and a protection circuit 80.

3-1. Specific Configuration of Low-Noise Amplifier

The low-noise amplifier 20 includes the FET 21, transistors Tr1 and Tr2, capacitors C4 and C5, inductors L2 and L3, and a resistor R2. The low-noise amplifier 20 has a configuration in which the FET 21 and the transistor Tr1 are cascode connected to each other. In other words, the FET 21 and the transistor Tr1 function as amplification elements of the low-noise amplifier 20. The source of the FET 21 is connected to ground via the inductor L3. The inductor L3 is an impedance matching element for increasing the linearity of the amplification characteristic.

The transistors Tr1 and Tr2 are FETs. The transistors Tr1 and Tr2 are n-channel MOSFETs, but may instead be p-channel MOSFETs. The drain of the FET 21 and the source of the transistor Tr1 are connected to each other. A bias input terminal 16 is connected to the gate of the transistor Tr1 via the resistor R2, which is for generating a bias voltage. A voltage inputted to the bias input terminal 16 is converted into a voltage of a desired value by the resistor R2, and this converted voltage is applied to the gate of the transistor Tr1 as a suitable bias voltage. Furthermore, the capacitor C4, which is a DC cut capacitor, is serially connected between ground and a path connecting the resistor R2 and the gate of the transistor Tr1.

The transistor Tr2 functions as a switching element. The transistor Tr2 may instead be a bipolar transistor. The transistor Tr2 is serially connected between a power supply voltage Vdd and the drain of the transistor Tr1. Specifically, the drain of the transistor Tr2 is connected to the power supply voltage Vdd, and the source of the transistor Tr2 is connected to the drain of the transistor Tr1 via the inductor L2.

The gate of the transistor Tr2 is connected to a control terminal 15. The transistor Tr2 is switched between a conductive state and a non-conductive state by a voltage applied to the control terminal 15. The power supply voltage Vdd is supplied to the cascode-connected transistor Tr1 and FET 21 by putting the transistor Tr2 into a conductive state when the low-noise amplifier 20 is activated. In other words, not only supply of the bias voltage to the gate of FET 21, but also activating and stopping of the low-noise amplifier 20 can be switched by turning the transistor Tr2 on and off.

The inductor L2 and the capacitor C5 are elements for adjusting the gain of the low-noise amplifier 20. The output terminal 13 is connected to a connection point between the source of the transistor Tr1 and the inductor L2 via the capacitor C5.

Note that FIG. 8 illustrates an example in which the low-noise amplifier 20 includes two FETs that are cascode connected (specifically, the FET 21 and the transistor Tr1), but the low-noise amplifier 20 is not limited to this configuration. The low-noise amplifier 20 may include a single common-source FET 21 as an amplification element.

3-2. Specific Configuration of Input Matching Network

The input matching network 30 includes an inductor L1 and capacitors C2 and C3.

The inductor L1 is serially connected between ground and a path along which a reception signal is transmitted. The capacitor C3 is serially connected to the inductor L1. Specifically, one end of the inductor L1 is connected to a path connecting the third terminal 73 of the switch circuit 70 and the gate of the FET 21 to each other. The other end of the inductor L1 is connected to one end of the capacitor C3. The other end of the capacitor C3 is connected to ground. The inductor L1 and the capacitor C3 are a shunt inductor and a shut capacitor, respectively.

In this embodiment, the bias input terminal 14 is connected between the inductor L1 and the capacitor C3. Specifically, as illustrated in FIG. 8, the bias input terminal 14 is connected to a node N2, which is a connection point between the inductor L1 and the capacitor C3, via a resistor R1. A suitable bias voltage that is to be supplied to the gate of the FET 21 is generated by the resistor R1, the inductor L1, and the capacitor C3. In other words, the resistor R1, the inductor L1, and the capacitor C3 form the bias circuit 40 (not illustrated in FIG. 8).

Thus, a reduction in circuit scale and a reduction in module or IC size can be achieved by configuring the input matching network 30 and the bias circuit 40 to share at least some circuit elements. In addition, since the bias voltage inputted to the bias input terminal 14 is supplied to the gate of the FET 21 via the inductor L1, the time constant for low-frequency components can be reduced compared with the case where the bias voltage is not supplied via the inductor L1. In other words, the bias voltage supplied to the gate of the FET 21 can be rapidly made to have the desired value, and therefore an increase in speed can be realized for the low-noise amplifier 20. Furthermore, loss of signal power can be suppressed for a radio-frequency signal (reception signal) of the operation band by the impedance of the inductor L1 and therefore NF can be reduced.

The capacitor C2 is an example of a second capacitor that is serially connected along a path along which a reception signal is transmitted. Specifically, one end of the capacitor C2 is connected to the third terminal 73 of the switch circuit 70. The other end of the capacitor C2 is connected to a node N1 and one end of the inductor L1. The capacitor C2 is a series capacitor.

In this embodiment, the capacitance of the capacitor C2 is smaller than the capacitance of the capacitor C1. For example, the capacitance of the capacitor C2 is less than or equal to half of the capacitance of the capacitor C1, but may be less than or equal to ¼ or less than or equal to ¹⁄₁₀ of the capacitance of the capacitor C1. As an example, the capacitance of the capacitor C2 is 0.3 pF and the capacitance of the capacitor C1 is 3 pF. The input impedance seen when looking at the gate of the FET 21 from the third terminal 73 can be increased by reducing the capacitance of the capacitor C2. Furthermore, the time constant of the bias circuit 40 for low frequencies can be reduced and the start-up speed of the low-noise amplifier 20 can be increased by reducing the capacitance of the capacitor C2.

In the amplification circuit 10b, in the case where a reception signal is received by the antenna ANT and the low-noise amplifier 20 amplifies the reception signal (reception time), a suitable bias voltage (for example, a positive voltage) is supplied to the gate of the FET 21 via the bias input terminal 14 and the input matching network 30. In the case where a transmission signal is to be transmitted from the antenna ANT (transmission time), operation of the low-noise amplifier 20 can be halted by setting the bias voltage to 0 V.

3-3. Specific Configurations of Capacitor C1 and Protection Circuit

The capacitor C1 is an example of a first capacitor that is serially connected between the node N1 and the switch SW5. In other words, the capacitor C1 is serially connected to the switch SW5. Note that the node N1 is identical to the node N illustrated in FIGS. 1 and 2 and is located on a path connecting the input matching network 30 and the gate of the FET 21 to each other.

The capacitor C1 has a sufficiently low impedance in the operation band of the low-noise amplifier 20. Therefore, the impedance of the gate of the FET 21, which is the input terminal of the low-noise amplifier 20, can be made sufficiently low when the switch SW5 is in a conductive state even when the capacitor C1 is connected in series with the switch SW5. In other words, when the switch SW5 is put into a conductive state at a transmission time, it is possible to suppress a situation in which the leakage signal 90 is supplied to the gate, as with the case where the capacitor C1 is not provided.

The protection circuit 80 is connected in parallel with the switch SW5 and is connected in series with the capacitor C1. Specifically, the protection circuit 80 includes two diodes D1 and D2 (anti-parallel diode pair) that are connected in parallel with each other in opposite directions. More specifically, the anode of the diode D1 and the cathode of the diode D2 are connected to each other and are then connected to the node N1 via the capacitor C1. The cathode of the diode D1 and the anode of the diode D2 are connected to each other and are then connected to ground. The diodes D1 and D2 have the same forward voltage Vf. The protection circuit 80 may also be called a limiter, and the diodes D1 and D2 may also be called limiter diodes.

The protection circuit 80 performs control such that the potential of the node N1 connected thereto via the capacitor C1 lies within a prescribed range. Thus, the protection circuit 80 can suppress supplying of a large amount of power to the gate of the FET 21 and can suppress damage to the FET 21. In addition, since the protection circuit 80 is connected in parallel with the switch SW5, damage to the switch SW5 caused by a large amount of power can also be suppressed. The protection circuit 80 can suppress damage to the FET 21 and the switch SW5 caused by not only a reception signal received by the antenna ANT but also a leakage signal at the time of transmission of a transmission signal.

The capacitor C1, which is serially connected between the protection circuit 80 and the node N1, can suppress the bias voltage supplied to the gate of the FET 21 from being supplied to the protection circuit 80. In other words, the symmetry of both the positive and negative waveforms of the limiter operation can be maintained because the bias voltage is unlikely to be applied to the diodes D1 and D2 of the protection circuit 80. In other words, the capacitor C1 is used to both improve the operation and reliability of the switch SW5 and improve the limiter operation of the protection circuit 80. Since the capacitor C1 is arranged between the input matching network 30 and the gate of the FET 21, that is, in a section having a higher impedance than the input side of the input matching network 30 (switch circuit 70 side), the capacitance of the capacitor C1 can be reduced.

When the low-noise amplifier 20 is activated (i.e., at a reception time), the switch SW5 is not in a conductive state and the bias voltage is lower than the forward voltage Vf of the diode D1 included in the protection circuit 80. This means that diode D1 does not even transiently enter a conductive state. Therefore, even if the capacitance of capacitor C1 is set to a large value, since the effect on the time constant for low frequencies is sufficiently small, the low-noise amplifier 20 can be activated quickly.

In the amplification circuit 10b illustrated in FIG. 8, a case is illustrated in which the switch SW5 includes an n-channel MOSFET having an on resistance Ron. The gate of the switch SW5 is connected to a control terminal 17 via a resistor R3. The resistor R3 is a bias resistor for generating a bias voltage. The resistor R3 does not have to be provided.

At a reception time, a negative bias voltage is applied to the gate of the switch SW5 via the control terminal 17 and the resistor R3 and as a result the loss caused by the switch SW5 can be sufficiently reduced due to the switch SW5 being made to be in a sufficiently non-conductive state. Here, in the case where the capacitor C1 is not provided, a positive bias voltage is applied to the drain of the switch SW5 (terminal on node N1 side). If the potential difference between the negative bias voltage of the gate of the switch SW5 and the positive bias voltage of the drain becomes too large, there is a risk of the switch SW5 breaking due to the withstand voltage of the switch SW5 being exceeded.

In contrast, in the amplification circuit 10b, a situation in which a large positive bias voltage is applied to the drain of the switch SW5 can be suppressed due to the capacitor C1 being serially connected to the switch SW5. Therefore, since a negative bias voltage can be applied to the gate of the switch SW5, damage to the switch SW5 can be suppressed while reducing loss to a sufficiently low level. In other words, the reliability of the amplification circuit 10b can be improved.

In addition, at a transmission time, a positive bias voltage is applied to the gate of the switch SW5 via the control terminal 17 and the resistor R3 and as a result supplying of the leakage signal 90 to the gate of the FET 21 can be suppressed due to the switch SW5 being put into a sufficiently conductive state. Here, the capacitor C1 is provided in order that a prescribed direct-current voltage can be applied to the gate of the FET 21 when the switch SW5 is in a conductive state. The direct-current voltage in this case is a voltage that is lower than the bias voltage used to activate the amplification operation of the FET 21. In other words, part of the bias voltage used to operate the FET 21 can be stored (pre-charged) in advance in the capacitor C1 and therefore the start-up time of the FET 21 when switching from transmission to reception can be shortened.

Thus, the value of the bias voltage supplied to the gate of the FET 21 at a transmission time may be greater than 0 V. Specifically, the value of the bias voltage at a transmission time may be greater than 0 V and lower than the bias voltage during operation, and may be a value of a magnitude that does not cause the FET 21 to operate as an amplification element.

In addition, it may be possible to reduce the on-resistance Ron of the switch SW5 by suppressing the application of a large positive bias voltage to the drain of the switch SW5. However, if the positive bias voltage applied to the gate of the switch SW5 is sufficiently high, this effect of reducing the on-resistance Ron is negligible.

Figure 9:
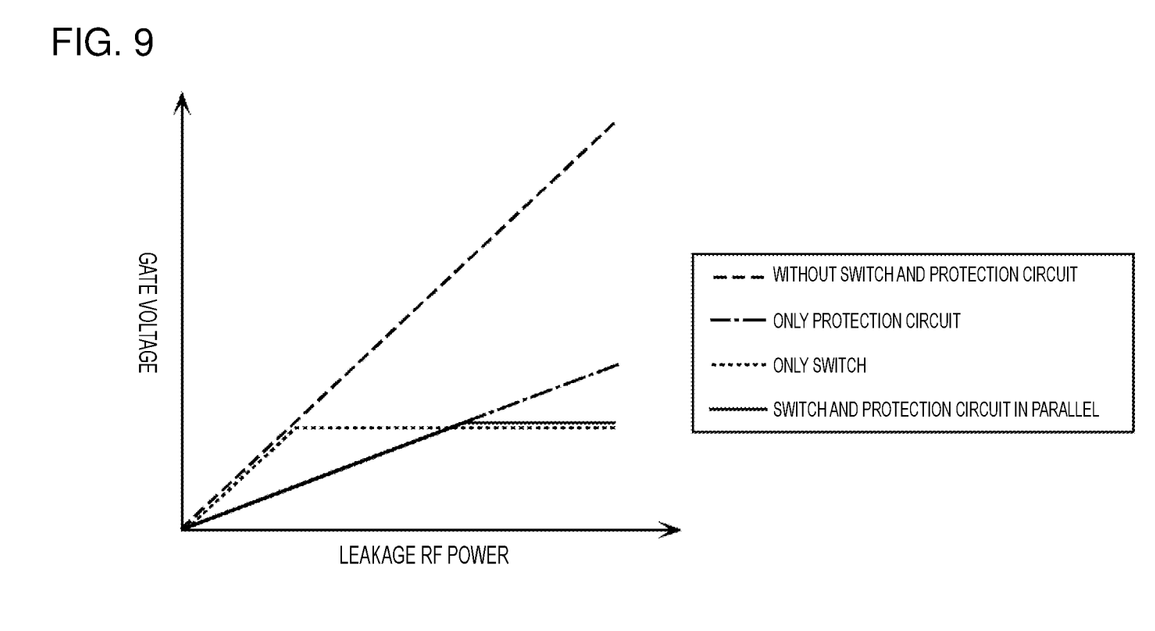
FIG. 9 is a diagram illustrating the relationship between the power of a leakage signal and a voltage supplied to the gate of an FET, which is an amplification element, for cases with and without a switch and a protection circuit.

FIG. 9 is a diagram illustrating the relationship between the size of the leakage signal 90 and the voltage supplied to the gate of the FET 21, which is an amplification element. Specifically, FIG. 9 illustrates the relationship for cases with and without the switch SW5 and the protection circuit 80. In FIG. 9, the horizontal axis represents the power of the leakage signal 90 and the vertical axis represents the voltage supplied to the gate of the FET 21.

As illustrated in FIG. 9, when neither the switch SW5 nor the protection circuit 80 is provided, the voltage applied to the gate of the FET 21 increases as the leakage signal 90 becomes larger. Therefore, as described using FIG. 4, the amount of electrons 91 accumulating in the gate insulating film 23 due to the leakage signal 90 also increases and this retards the start-up time of the low-noise amplifier 20.

In the case where only the protection circuit 80 is provided and the switch SW5 is not provided, the voltage applied to the gate of the FET 21 does not become greater than or equal to a predetermined value due to the limiter effect on the gate potential provided by the protection circuit 80. However, even when the power of the leakage signal 90 is small, the voltage applied to the gate of the FET 21 rises significantly and therefore retardation of the start-up time of the low-noise amplifier 20 is unavoidable.

In contrast, in the case where only the switch SW5 is provided and the protection circuit 80 is not provided, the ratio of the increase in the voltage of the gate of the FET 21 with respect to the power of the leakage signal 90 can be reduced due to the switch SW5 being in a conductive state. In other words, since it is possible to suppress an increase in the voltage of the gate of the FET 21 and reduce the accumulation of electrons 91 in the gate insulating film 23 even when the power of the leakage signal 90 is large, the start-up time of the low-noise amplifier 20 can be reduced.

In the case where a parallel circuit consisting of the switch SW5 and the protection circuit 80 is provided (the example illustrated in FIG. 8), the voltage applied to the gate of the FET 21 does not become greater than or equal to a prescribed value, and therefore the amount of electrons 91 accumulating in the gate insulating film 23 can be reduced. Thus, the start-up time of the low-noise amplifier 20 can be shortened.

4. Effects and so Forth

As described above, the amplification circuit 10, 10a, or 10b according to this embodiment includes the low-noise amplifier 20, which includes the FET 21 as an amplification element and amplifies a radio-frequency signal inputted to the gate of the FET 21, the input matching network 30 that matches the input impedance of the low-noise amplifier 20, and the switch SW5 that is serially connected between ground and the node N on the path connecting the input matching network 30 and the gate of the FET 21 to each other.

Thus, since the switch SW5 is serially connected between ground and the node N or N1, in the case where the input matching network 30 is coupled with another electrical circuit and signal leakage may occur, the node N or N1 can be set to the ground potential by turning the switch SW5 on (putting the switch SW5 into a conductive state). Thus, since the leakage signal 90 is unlikely to be supplied to the gate of the FET 21, accumulation of the electrons 91 in the gate insulating film 23 can be suppressed. Therefore, retardation of the rise of the low-noise amplifier 20 caused by the electrons 91 accumulating in the gate insulating film 23 is unlikely to occur, and therefore a high speed can be realized for the rise of the low-noise amplifier 20. Therefore, the amplification circuit 10, 10a, or 10b that can operate at high speed can be realized.

Furthermore, for example, no switch is serially connected along the path connecting the input matching network 30 and the gate of the FET 21 to each other.

If a series switch is connected along the path connecting the input matching network 30 and the gate of the FET 21 to each other, power loss would be generated due to the on resistance of the series switch and the NF of the low-noise amplifier 20 would be degraded. According to this embodiment, since no series switch is connected along the path connecting the input matching network 30 and the gate of the FET 21, power loss along the path can be reduced and degradation of the NF can be suppressed.

In addition, for example, the amplification circuit 10, 10a, or 10b further includes the first terminal 71, the second terminal 72, and the third terminal 73, the switch circuit 70 or 70a, which switches the first terminal 71 and the second terminal 72 and the first terminal 71 and the third terminal 73 between being in a conductive state and a non-conductive state with each other, the power amplifier 50, and the output matching network 60 that matches the output impedance of the power amplifier 50. The second terminal 72 is connected to the output terminal of the power amplifier 50 via the output matching network 60. The third terminal 73 is connected to the gate of the FET 21 via the input matching network 30. The input impedance of the input matching network 30 is higher than the output impedance of the input matching network 30.

As a result of the amplification circuit 10, 10a, or 10b including the output matching network 60 and the input matching network 30, the input matching network 30 couples with the output matching network 60 and leakage of a transmission signal from the output matching network 60 is more likely to occur. A transmission signal amplified by the power amplifier 50 is a signal having a higher power than a reception signal amplified by the low-noise amplifier 20. Therefore, in the case where a leakage signal is supplied to the FET 21 of the low-noise amplifier 20, either the FET 21 will fail or the start-up speed of the low-noise amplifier 20 will be reduced due to an increase in the threshold voltage of the FET 21. With the amplification circuit 10 or 10a according to this embodiment, it is possible to suppress supplying of the leakage signal 90 to the gate 21G of the FET 21 by putting the switch SW5 into a conductive state when a transmission signal is to be transmitted. Therefore, the amplification circuit 10, 10a, or 10b that can operate at high speed can be realized.

In addition, for example, a switch does not have to be serially connected between ground and the path connecting first terminal 71 and the input matching network 30 to each other.

Thus, the number of switches can be reduced, and therefore the amplification circuit 10a can be reduced in size.

Furthermore, for example, the amplification circuit 10b further includes the capacitor C1 that is serially connected between the node N1 and the switch SW5.

Thus, part of the bias voltage can be pre-charged using the capacitor C1 and therefore the low-noise amplifier 20 can be activated even faster.

Furthermore, for example, the input matching network 30 includes the capacitor C2 that is serially connected along the path along which a radio-frequency signal (reception signal) is transmitted. The capacitance of the capacitor C2 is smaller than the capacitance of the capacitor C1.

Thus, as a result of the capacitor C2 having a small capacitance, the time constant for a low-frequency signal can be made small. Therefore, the bias voltage supplied to the gate of the FET 21 can be rapidly increased, and therefore an increase in start-up speed can be realized for the low-noise amplifier 20.

In addition, for example, the amplification circuit 10b further includes the protection circuit 80 that is connected in parallel with the switch SW5 and is connected in series with capacitor C1. At this time, the protection circuit 80, for example, includes two diodes D1 and D2 that are connected in parallel with each other in opposite directions.

Thus, it is possible to suppress the bias voltage supplied to the gate of the FET 21 from becoming greater than or equal to a prescribed value, and therefore the protection effect for the low-noise amplifier 20 can be increased.

In addition, for example, the switch SW5 includes an FET.

Furthermore, for example, the amplification circuit 10, 10a, or 10b may further include the protection circuit 80 serially connected between ground and the node N or N1. At this time, the protection circuit 80, for example, includes two diodes D1 and D2 that are connected in parallel with each other in opposite directions.

Thus, it is possible to suppress the bias voltage supplied to the gate of the FET 21 from becoming greater than or equal to a prescribed value, and therefore the protection effect for the low-noise amplifier 20 can be increased.

In addition, for example, the input matching network 30 includes the inductor L1 that is serially connected between ground and a path along which a radio-frequency signal (reception signal) is transmitted and the capacitor C3 that is serially connected to the inductor L1.

Thus, loss of signal power can be suppressed for a radio-frequency signal (reception signal) of the operation band by the impedance of the inductor L1 and therefore NF can be reduced.

Furthermore, for example, the amplification circuit 10b further includes the bias input terminal 14 to which a bias voltage of an amplification element is inputted. The bias input terminal 14 is connected between the inductor L1 and the capacitor C3.

Thus, since the bias voltage is supplied via the inductor L1, the time constant for low-frequency components can be reduced and a high speed can be realized for the low-noise amplifier 20 compared with the case where the bias voltage is not supplied via the inductor L1. In addition, since at least some of the circuit elements of the input matching network 30 can be shared by the bias circuit 40, the circuit scale can be reduced and a reduction in the size of a module or IC can be realized.

Embodiment 2

Next, embodiment 2 will be described.

Figure 10:
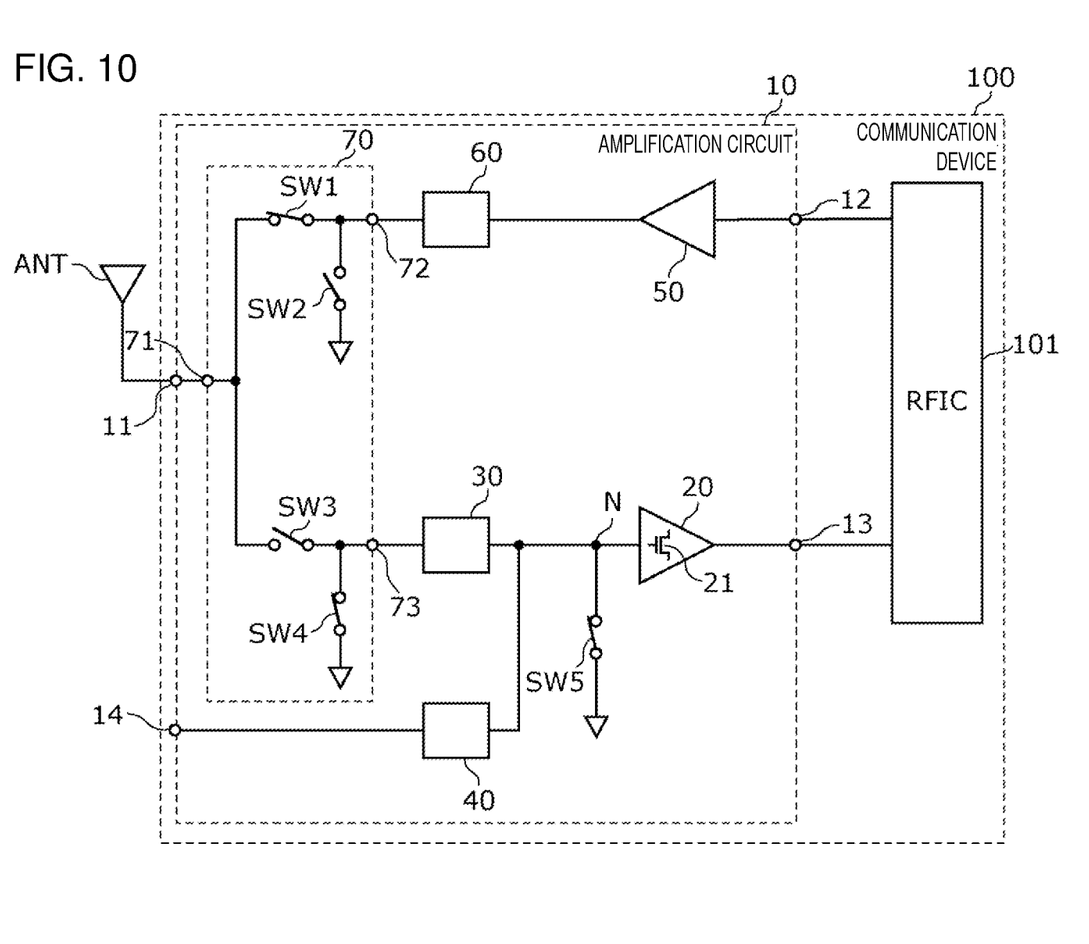
FIG. 10 is a circuit configuration diagram illustrating an example of a communication device according to embodiment 2.

FIG. 10 is a circuit configuration diagram illustrating a communication device 100 according to this embodiment. As illustrated in FIG. 10, the communication device 100 includes an amplification circuit 10 and an RFIC 101.

The amplification circuit 10 is the same as the amplification circuit 10 according to embodiment 1. The communication device 100 may include the amplification circuit 10a or 10b instead of the amplification circuit 10.

The RFIC 101 is an example of an RF signal processing circuit that processes radio-frequency signals transmitted and received by the antenna ANT. Specifically, the RFIC 101 processes a radio-frequency signal (reception signal) that has been amplified by the low-noise amplifier 20 of the amplification circuit 10. For example, the RFIC 101 performs signal processing such as down conversion on a reception signal amplified by the low-noise amplifier 20, and the signal obtained via this signal processing is outputted to a baseband signal processing circuit (not illustrated). In addition, the RFIC 101 performs signal processing such as up conversion on a signal inputted from the baseband signal processing circuit and a transmission signal obtained via this signal processing is outputted to the power amplifier 50 of the amplification circuit 10. The RFIC 101 is connected to the input terminal 12 and the output terminal 13 of the amplification circuit 10.

Furthermore, the RFIC 101 includes a control unit (not illustrated) that controls switching on and off of the switches of the amplification circuit 10. Specifically, the RFIC 101 supplies, to the respective gates (or bases), control signals for switching the switches SW1 to SW5 and the transistor Tr2 between conductive and non-conductive states. In addition, the RFIC 101 controls supplying and stopping of the bias voltage to the bias input terminals 14 and 16.

As described above, the communication device 100 according to this embodiment includes the amplification circuit 10, 10a, or 10b and the RFIC 101 that processes a radio-frequency signal amplified by the low-noise amplifier 20.

Thus, the communication device 100 that can operate at high speed can be realized.

OTHER MATTERS

Although amplification circuits and a communication device have been described above on the basis of embodiments of the present disclosure, the present disclosure is not limited to the above embodiments.

For example, a circuit that may be electromagnetically coupled with the input matching network 30 does not have to be the output matching network 60. Specifically, the amplification circuit 10, 10a, or 10b does not have to include the power amplifier 50, which amplifies a transmission signal, the output matching network 60, and the switch circuit 70. In this case, the input matching network 30 may electromagnetically couple with an electronic circuit other than the output matching network 60. For example, in the case where a local oscillator is arranged in the vicinity of the input matching network 30, the input matching network 30 may supply a leakage signal 90 to the gate of the FET 21 as a result of electromagnetically coupling with the local oscillator. In this case as well, it is possible to suppress supplying of the leakage signal 90 to the FET 21 by putting the switch SW5 into a conductive state.

Furthermore, for example, one or more switches may be serially connected along a path connecting the input matching network 30 and the gate of the FET 21 to each other.

In addition, for example, the protection circuit 80 may be directly connected to the path connecting the input matching network 30 and the gate of the FET 21 to each other. Specifically, the protection circuit 80 may be connected in parallel with a series circuit consisting of the capacitor C1 and the switch SW5. In addition, the amplification circuit 10b does not have to include at least one out of the capacitor C1 and the protection circuit 80.

Furthermore, for example, the input matching network 30 may further include an inductor that is serially connected along a path connecting the third terminal 73 of the switch circuit 70 and the gate of the FET 21 to each other. Specifically, in the amplification circuit 10b illustrated in FIG. 8, an inductor is serially connected along a path connecting the node N1 and a connection point between the capacitor C2 and the inductor L1.

In addition, for example, the capacitor C2 may be a DC-cut capacitor rather than a capacitor for matching the input impedance. A capacitor with a higher capacitance than a capacitor for input matching is required as a DC-cut capacitor. For example, a capacitance of at least 5 pF is required for a DC-cut capacitor. Therefore, as an example, the capacitance of the capacitor C2 for DC cutting is 10 pF, for example. The capacitance of the capacitor C2 for input matching is 0.3 pF, for example. An appropriate circuit configuration and circuit elements having appropriate capacitances, inductances, or resistances in accordance with the frequency band required for the low-noise amplifier 20 are used as the circuit configuration and the circuit elements of the input matching network 30.

The amplification circuit 10, 10a, or 10b may be used in a device that processes radio-frequency signals other than a communication device. The first amplifier does not have to be a low-noise amplifier that amplifies a reception signal and the second amplifier does not have to be a power amplifier that amplifies a transmission signal. The first amplifier and the second amplifier, for example, may perform amplification of radio-frequency signals that are processed inside a certain signal processing device.

In addition, the present disclosure also includes embodiments obtained by making various modifications, as conceived of by those skilled in the art, to the above embodiments and embodiments realized by arbitrarily combining the constituent elements and functions of the above embodiments so long as the resulting embodiments do not depart from the gist of the present disclosure.

The present disclosure can be broadly used in communication devices such as mobile phones as an amplification circuit that amplifies radio-frequency signals, as a communication device, and so forth.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplification circuit comprising:
a first amplifier that comprises a field effect transistor (FET) as an amplification element, and that is configured to amplify a radio-frequency (RF) signal input to a gate of the FET;
an input matching network configured to match an input impedance of the first amplifier;
a switch that is serially connected between ground and a node on a path connecting the input matching network and the gate to each other;
a switch circuit having a first terminal, a second terminal, and a third terminal, and that is configured to selectively switch connection of the first terminal to the second terminal and the first terminal to the third terminal;
a second amplifier; and
an output matching network configured to match an output impedance of the second amplifier,
wherein the second terminal is connected to an output terminal of the second amplifier via the output matching network,
the third terminal is connected to the gate of the FET via the input matching network, and
an input impedance of the input matching network is greater than an output impedance of the input matching network.

2. The amplification circuit according to claim 1, wherein no switch is serially connected in the path.

3. The amplification circuit according to claim 1, wherein no switch is serially connected between ground and a path connecting the first terminal and the input matching network to each other.

4. The amplification circuit according to claim 1, further comprising:
a first capacitor,
wherein the first capacitor and the switch are serially connected between the node and ground.

5. The amplification circuit according to claim 4,
wherein the input matching network comprises a second capacitor that is serially connected along a path along which the RF signal is transmitted, and
a capacitance of the second capacitor is less than a capacitance of the first capacitor.

6. The amplification circuit according to claim 4, further comprising:
a protection circuit that is connected in parallel with the switch and that is connected in series with the first capacitor.

7. The amplification circuit according to claim 1, wherein the switch comprises an FET.

8. The amplification circuit according to claim 1, further comprising:
a protection circuit that is serially connected between the node and ground.

9. The amplification circuit according to claim 1, wherein the input matching network comprises:
an inductor that is serially connected between ground and a path along which the RF signal is transmitted, and
a third capacitor that is serially connected to the inductor.

10. The amplification circuit according to claim 9, further comprising:
a bias input terminal to which a bias voltage of the amplification element is input;
wherein the bias input terminal is connected between the inductor and the third capacitor.

11. A communication device comprising:
the amplification circuit according to claim 1; and
an RF signal processing circuit configured to process the RF signal amplified by the first amplifier.

* * * * *